（12） United States Patent
Khan (10) Patent No.: US 10,000,845 B2
(45) Date of Patent: Jun. 19, 2018

(54) MOCVD SYSTEM FOR GROWTH OF III-NITRIDE AND OTHER SEMICONDUCTORS

(71) Applicant: University of South Carolina, Columbia, SC (US)

(72) Inventor: Asif Khan, Irmo, SC (US)

(73) Assignee: University of South Carolina, Columbia, SC (US)

( * ) Notice: Subject to any disclaimer, the term of this patent is extended or adjusted under 35 U.S.C. 154(b) by 0 days. days.

(21) Appl. No.: 15/628,710

(22) Filed: Jun. 21, 2017

(65) Prior Publication Data

US 2017/0369995 A1 Dec. 28, 2017

Related U.S. Application Data

(60) Provisional application No. 62/353,133, filed on Jun. 22, 2016.

(51) Int. Cl.
*C23C 16/44* (2006.01)
*C23C 16/30* (2006.01)
*H01L 21/02* (2006.01)

(52) U.S. Cl.
CPC ........ *C23C 16/4411* (2013.01); *C23C 16/303* (2013.01); *H01L 21/0254* (2013.01); *H01L 21/0262* (2013.01)

(58) Field of Classification Search
CPC ............... C23C 16/4411; C23C 16/303; H01L 21/0254; H01L 21/0262
See application file for complete search history.

(56) References Cited

U.S. PATENT DOCUMENTS

| 4,579,080 | A | * | 4/1986 | Martin | ................ | C23C 16/4411 |
| | | | | | | 118/500 |
| 5,070,815 | A | | 12/1991 | Kasai et al. | | |
| 5,647,945 | A | * | 7/1997 | Matsuse | .................... | C23C 8/06 |
| | | | | | | 156/345.38 |
| 5,972,116 | A | * | 10/1999 | Takagi | ................ | C23C 16/4401 |
| | | | | | | 118/719 |
| 6,228,253 | B1 | | 5/2001 | Gandman | | |
| 2008/0163816 | A1 | | 7/2008 | Toda et al. | | |
| 2011/0092070 | A1 | * | 4/2011 | Hara | ....................... | C23C 16/16 |
| | | | | | | 438/680 |
| 2011/0274851 | A1 | * | 11/2011 | Miyazawa | ............ | C01B 33/035 |
| | | | | | | 427/546 |
| 2012/0234238 | A1 | | 9/2012 | Hsu et al. | | |

(Continued)

*Primary Examiner* — Karen Kusumakar
(74) *Attorney, Agent, or Firm* — Dority & Manning, P.A.

(57) ABSTRACT

An MOCVD system for growing a semiconductor layer on a substrate is provided. The MOCVD system includes an MOCVD growth chamber defined by a jacket having an interior surface and an exterior surface; a water flow chamber surrounding an exterior surface of the jacket of the MOCVD growth chamber; an electronic control system, wherein the electronic control system facilitates pulsed growth of the semiconductor layer; a supply tube comprising a head formed from a hollow structure defining a fitting end and an opposite, shower end, wherein the fitting end has an initial diameter that is less than a diameter at the shower end; and a susceptor configured to hold the substrate and facing the shower end of the supply tube, wherein the MOCVD system operates at a temperature greater than or equal to 1500° C.

20 Claims, 7 Drawing Sheets

(56) References Cited

U.S. PATENT DOCUMENTS

| | | |
|---|---|---|
| 2013/0056770 A1 | 3/2013 | Shatalov et al. |
| 2014/0110727 A1 | 4/2014 | Bilenko et al. |
| 2015/0079769 A1 | 3/2015 | Kim et al. |

* cited by examiner

MOCVD SYSTEM FOR GROWTH OF III-NITRIDE AND OTHER SEMICONDUCTORS

PRIORITY INFORMATION

The present application claims priority to U.S. Provisional Patent Application Ser. No. 62/353,133 titled "MOCVD System Growth of III-Nitride and Other Semiconductors" filed on Jun. 22, 2016, the disclosure of which is incorporated by reference herein.

BACKGROUND

Group III-nitride and its ternary and quaternary compounds are prime candidates for fabrication of visible and ultraviolet high-power and high-performance optoelectronic devices and electronic devices. These devices are typically grown epitaxially as thin films by growth techniques including molecular beam epitaxy (MBE), metalorganic chemical vapor deposition (MOCVD), or hydride vapor phase epitaxy (HVPE).

In conventional MOCVD, the precursors (such tri-methyl gallium, ammonia etc.) are supplied continuously to the reactant chamber. Growing III-nitride and other semiconductors requires a very high growth temperature (e.g., about 1000° C. to about 1100° C.). Even higher temperatures are required for growth utilizing relatively large percentages of certain materials, such as those including Group III elements such as Al, B or Ga, and/or Group V elements such as As, N, P, and Sb, such as at growth temperatures of about 1300° C. to about 1450° C. At these extremely high temperatures, however, the precursors tend to combine in the chamber and "rain down" onto the surface of the substrate, effectively forming adduct particles thereon. These adduct formations during MOCVD hamper the subsequent epilayer growths by increasing the number of stacking faults as well as the dislocation density.

A pulsed metal organic chemical vapor deposition (P-MOCVD) or pulsed atomic layer epitaxy (PALE), in which the precursors are supplied with alternative supply of sources, alleviates the above mentioned problem. This alternative or pulsing technique not only suppress the adduct formation but also provides a unique opportunity to bend the dislocation propagation, to deposit monolayers of material thereby decreasing the slip (which is often the reason for stacking fault generation). Thus, P-MOCVD makes an attractive technique for substrate and epilayer growth and device fabrication.

Although the P-MOCVD alleviates some of the potential problems plaguing III-nitride devices (especially over non-polar substrates and materials) and represents an enabling technology for the growth of non-polar III-nitride devices, the relatively high defect density in the directly-grown non-polar or semi-polar III-nitride films reduces the efficiency of subsequently grown devices compared to what could be achieved by homoepitaxial growth on a perfect substrate.

Thus, a need exists for a more efficient system for MOCVD growth of group III, group V, group III-V, or any other type of semiconductor material, where higher temperatures and pulsing can be utilized but with a decrease in defect density on the formed films.

SUMMARY

Objects and advantages of the invention will be set forth in part in the following description, or may be obvious from the description, or may be learned through practice of the invention.

In one particular embodiment of the present invention, an MOCVD system for growing a semiconductor layer on a substrate is provided. The MOCVD system includes an MOCVD growth chamber defined by a jacket having an interior surface and an exterior surface; a water flow chamber surrounding an exterior surface of the jacket of the MOCVD growth chamber; an electronic control system, wherein the electronic control system facilitates pulsed growth of the semiconductor layer; a supply tube comprising a head formed from a hollow structure defining a fitting end and an opposite, shower end, wherein the fitting end has an initial diameter that is less than a diameter at the shower end; and a susceptor configured to hold the substrate and facing the shower end of the supply tube, wherein the MOCVD system operates at a temperature greater than or equal to 1500° C.

In one embodiment, the water flow chamber can be connected to a water supply line.

In another embodiment, the MOCVD system can further include a liner, wherein the liner can be replaceable. The liner can include quartz, boron nitride, a ceramic, or a combination thereof.

In still another embodiment, the jacket can include quartz.

In yet another embodiment, the head can be conical, wherein the fitting end can have an initial diameter that is less than a diameter at the shower end, further wherein the head can define an expanding area along its length. Further, the conical head can include quartz, boron nitride, a ceramic, or a combination thereof.

In one more embodiment, a shower plate can be attached to the shower end of the conical head. In addition, the shower plate can define a plurality of apertures therein. Further, the apertures can be substantially equally spaced across the shower plate. Moreover, the shower plate can include quartz, boron nitride, a ceramic, or a combination thereof.

In an additional embodiment, the supply tube can be connected to an arm, wherein the arm can facilitate movement of the supply tube towards the substrate and the susceptor. Further, a supply tube moving element can control the movement of the arm.

In one more embodiment, the susceptor can be connected to an arm, wherein the arm can facilitate movement of the substrate and susceptor towards the supply tube. Further, a susceptor moving element can control the movement of the arm.

In another embodiment, a steel sealing can be attached to the fitting end of the head to form an air-tight seal.

A method for growing a semiconductor layer on a surface of a substrate is also provided The method can include introducing a source gas into the MOCVD chamber of through the supply tube, wherein the supply tube defines a terminal end at a distance of about 0.5 inches to about 10 inches from the surface of the substrate, wherein the source gas comprises at least one of a metal-organic source gas, a boron source gas, or a nitrogen source gas; and cooling the MOCVD chamber via the water flow chamber, wherein water is delivered to the water flow chamber via a water supply line.

In one particular embodiment, a liner can be disposed on the interior surface of the MOCVD chamber, wherein the liner can be removed from the MOCVD chamber and replaced with a new liner after the semiconductor layer is removed from the MOCVD chamber and before an additional semiconductor layer is grown in the MOCVD chamber.

In another embodiment, the semiconductor layer can include a group III layer or a group III-V layer. For instance, the semiconductor layer can be an AlInGaBN layer.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which:

FIG. 2b shows a cross-sectional view of the straight supply pipe and supply nozzle of FIG. 1a;

FIG. 3b shows a side view of the bent supply pipe of FIG. 2a;

Repeat use of reference characters in the present specification and drawings is intended to represent the same or analogous features or elements of the present invention.

DEFINITIONS

Chemical elements are discussed in the present disclosure using their common chemical abbreviation, such as commonly found on a periodic table of elements. For example, boron is represented by its common chemical abbreviation B; nitrogen is represented by its common chemical abbreviation N; and so forth.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Methods are generally provided that increase the growth rate of semiconductor materials including Group III semiconductor layers, Group III-V semiconductor layers, or any other semiconductor layers. In one particular embodiment, the semiconductor layer can be AlInGaBN. The methods described herein allow for an increased growth rate of semiconductor materials while maintaining the single crystal material quality for such materials. A system that facilitates an increase in growth rate is also contemplated by the present invention. For instance, in one embodiment, the distance between the injector and the susceptor can be decreased, either by a nozzle lowering element, a susceptor raising element, or a combination thereof. In another embodiment, a modified nozzle injector is generally provided for a MOCVD system, where the particular geometry of the nozzle injector can be configured to introduce the metallic precursor gas(es), such as metal organic gas(es), very close to the susceptor, and thus the growth surface. In still another embodiment, the MOCVD system can include a water flow chamber that surrounds an exterior surface of the MOCVD growth chamber, where the water flow chamber can allow the system to operate at higher temperatures, such as temperatures greater than or equal to 1500° C. Further, the MOCVD system can include an electronic control system that facilitates pulsed growth of the semiconductor layer. These features can increase the efficiency and speed semiconductor growth, while at the same time ensuring that the resulting semiconductor layer has minimal defects.

Methods are also generally provided for growing extremely one or more low defect density non-polar and semi-polar semiconductor layers (e.g., III-nitride layers, III-V nitride layers, etc.) over a base layer, and the resulting structures. In one particular example, an AlInGaBN layer can be achieved on a non-polar or semi-polar base layer, with little or no defect density, while maintaining uniformity across the AlInGaBN layer despite the AlInGaBN layer being formed at a relatively fast growth rate, where an increased MOCVD chamber temperature (e.g., greater than or equal to about 1500° C., such as from about 1500° C. to about 2000° C., such as from about 1500° C. to about 1800° C., such as from about 1500° C. to about 1600° C.) can contribute to the ability to form the semiconductor layer at a relatively fast growth rate.

I. Base Layer

According to the present invention, the epilayer to be selectively doped (e.g., a III-nitride layer, III-V nitride layer, etc.) can be formed on any suitable non-polar or semi-polar base layer. Suitable base layers can include materials such as but are not limited to, sapphire, silicon carbide, lithium aluminate, spinel, gallium nitride, aluminum nitride, aluminum gallium nitride, indium gallium nitride, aluminum indium gallium nitride, and the like. In one particular embodiment, the base layer is in the form of a substrate. Any suitable non-polar or semi-polar substrate can be used as the base layer to grow the semiconductor epilayer. Although the following description discusses a "substrate", other types of base layers can be used in accordance with the present invention.

Non-polar substrates generally encompass those grown in a-plane, r-plane, or m-plane. For example, the non-polar substrate can be an m-face or r-plane sapphire substrate such that there is no polarization charge supplied in the device layers of this structure.

Non-polar and semi-polar III-Nitride substrates are of great interest to the nitride semiconductor device community because they enable the deposition of improved device active regions that can be used to realize new and improved high performance optoelectronic and electronic nitride semiconductor devices. Some theoretical predictions believe that non-polar and semi-polar GaN will enable higher quantum efficiencies and improved electrical characteristics for light emitting diodes (LEDs) and laser diodes and will enable the development of very high performance enhancement mode (e-mode) high electron mobility transistors (HEMTs). While such predictions have been partially corroborated by experiment, previous attempts to fabricate devices on non-polar GaN were severely hampered by the presence of very high defect densities in the active regions which had origins in the substrates and which derived from the heteroepitaxial approaches used in the non-native approach to their fabrication.

II. Epilayer Growth

No matter the starting base layer for forming the substrate, a group III nitride epilayer is grown over the base layer. "Group III nitride" refers to those semiconducting compounds formed between elements in Group III of the periodic table and nitrogen. More preferably the Group III element is selected from the group consisting of aluminum (Al), gallium (Ga), and/or indium (In). Ternary and quaternary compounds (e.g., AlGaN and AlInGaN) are particularly preferred. As is well understood in the art, the Group III elements can combine with nitrogen to form binary compounds (e.g., GaN, AlN and InN), ternary compounds (e.g., AlGaN, AlInN, and GaInN), and quaternary compounds (i.e., AlInGaN). In other embodiments, a group III-V nitride epilayer can be grown over the base layer. "Group III-V nitride" refers to those semiconducting compounds formed between elements in Groups III and V of the period table and nitrogen, where Group III is as defined above and a Group V element is selected from the group consisting of vanadium (V), niobium (Nb), tantalum (Ta) and dubnium (Db).

In one particular embodiment, the methods can be utilized to grow a layer of AlInGaBN. In this embodiment, the group III nitride epilayer can be composed of any combination of group III elements (e.g., Al, In, and Ga), boron, and nitride. In one particular embodiment, the group III-nitride epilayer can be represented by the formula $Al_xIn_yGa_{1-x-y}BN$, wherein $0 \leq x \leq 1$, $0 \leq y \leq 1$ and $0 < x+y \leq 1$. In employing growth techniques to grow the group III nitride epilayer, the precursor source gases typically include at least one metal-organic source (e.g., trimethyl aluminum, trimethyl gallium, triethyl gallium, trimethyl indium, triethylalluminum, AlCl, $AlCl_3$ or combinations thereof), a boron source (e.g., trimethyl boron, triethyl boron), a nitrogen source (e.g., ammonia), a carrier gas (e.g., argon, hydrogen, nitrogen, etc.), and an optionally doping source (e.g., silane, biscyclopentadienyl magnesium, etc.). Of course, other materials can be utilized to grow the group III nitride or the group III-V epilayer, and the present invention is not intended to be limited by the above listed materials. For example, another type of metal-organic source, boron source, and/or nitrogen source can be utilized to grow the group III nitride epilayer.

Figure 1A:
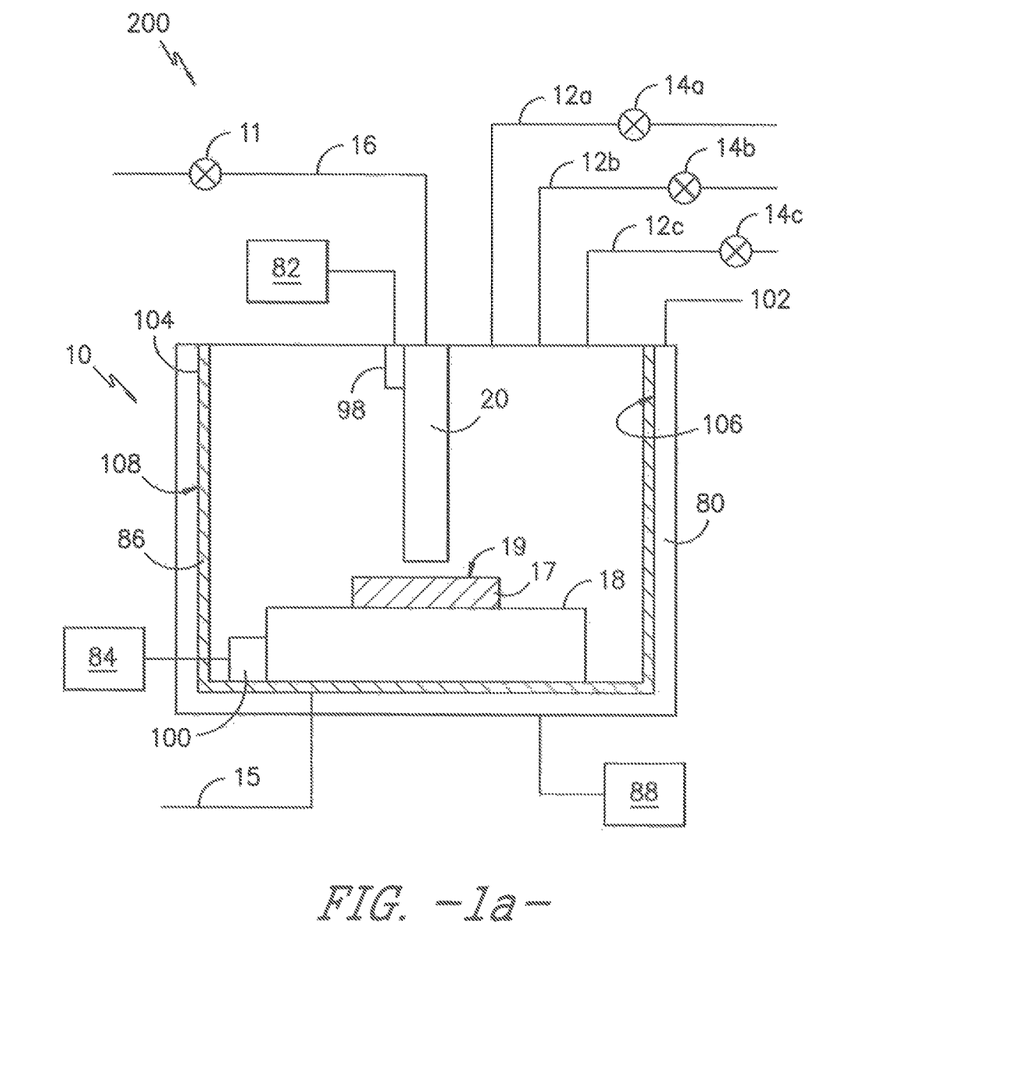
FIG. 1a shows a schematic diagram of an exemplary MOCVD growth chamber for use in certain embodiments of the present invention.
Figure 1B:
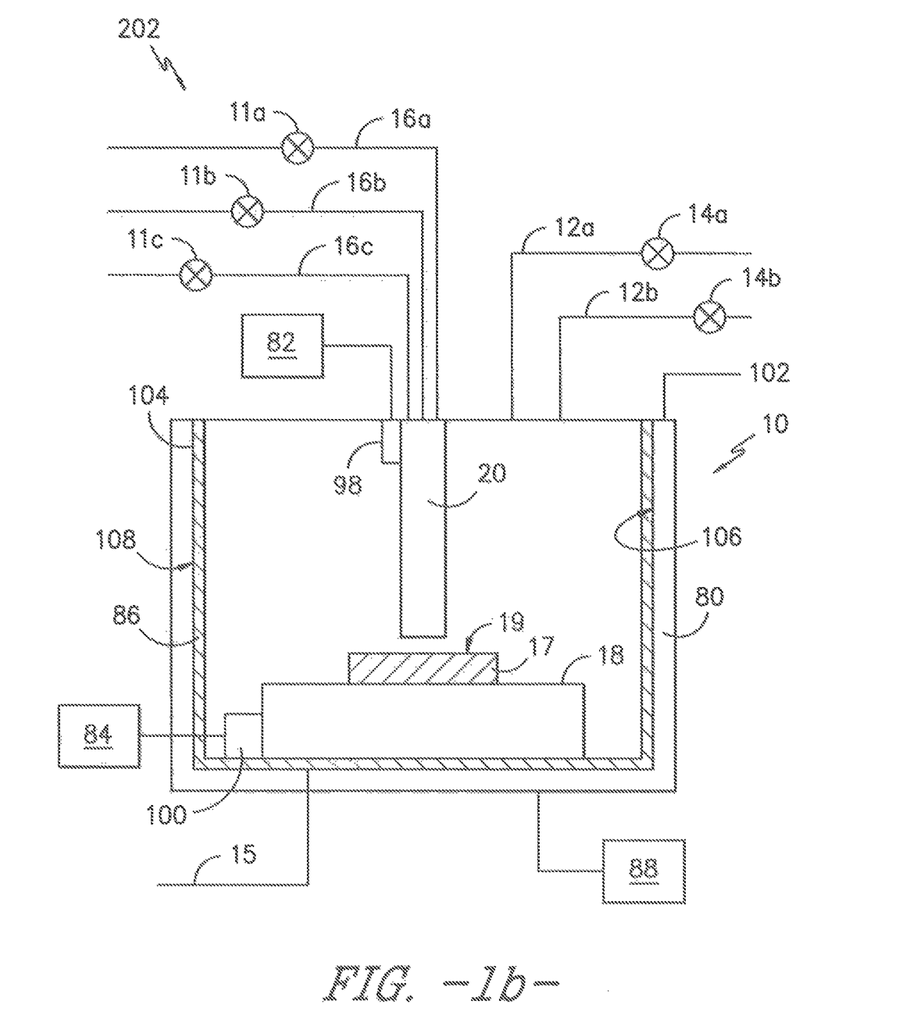
FIG. 1b shows a schematic diagram of another exemplary MOCVD growth chamber for use in certain embodiments of the present invention.

During MOCVD growth of the group III nitride epilayer, group III-V nitride epilayer, or any other desired semiconductor epilayer, the source gases are supplied in a vapor phase to the growth chamber. Referring to FIGS. 1a and 1b, schematic of exemplary MOCVD growth systems 200 and 202, respectively, including MOCVD chambers 10 are generally shown. The MOCVD growth chamber 10 is defined by a jacket 104 having an interior surface 106 and an exterior surface 108, where the jacket 104 can be formed from quartz, and includes a susceptor 18 configured to hold or support a substrate or wafer 17, as is known in the art. Vacuum line 15 is configured to control the pressure within the MOCVD growth chamber 10, also as known in the art.

Further, the MOCVD systems 200 and 202 can each include a water flow chamber 80 connected to water supply line 102. The water flow chamber 80 can surround the exterior surface 108 of the jacket 104. Moreover, the water flow chamber 80 can be double-walled. In any event, the water flow chamber 80 enables high temperature operation of the MOCVD system 200 and 202, which increases the efficiency of semiconductor layer growth, without causing excessive heating of the jacket 104, which can lead to defects in the resulting layer formation. In addition, the MOCVD systems 200 and 202 can include a liner 86. The liner 86 can include quartz, boron nitride, a ceramic, or a combination thereof and can cover or be disposed on the interior surface 106 of the jacket 104. In some embodiments, the liner 86 can be replaceable and can be removed between runs in the MOCVD system 200 or 202 to protect the jacket 104 from unnecessary depositions.

Referring still to FIGS. 1a and 1b, the MOCVD systems 200 and 202 can also include an electronic control system 88. The electronic control system 88 can enable a pulsed MOCVD growth where the reactants can be supplied to the MOCVD growth chamber 10 in a cyclic fashion to avoid the formation of gas phase adducts.

In FIG. 1a, multiple supply lines 12a, 12b, 12c are shown connected to the MOCVD growth chamber 10 in order to introduce supply gases therein, with flow controllable via respective supply valves 14a, 14b, 14c, from a respective supply tank (not shown). Each supply line 12a, 12b, 12c is configured to introduce a supply gas generally into the MOCVD growth chamber 10, and can be used as purge gases, growth gases, etc. Although shown with three general supply lines 12a, 12b, 12c, any suitable number of supply lines can be utilized within the scope of this invention. Supply line 16 is shown introducing a supply gas into the internal supply tube 20, with flow controllable via supply valve 11. The internal supply tube 20 is configured to introduce the supply gas into the MOCVD growth chamber 10 at a close proximity to the surface 19 of the wafer 17 on the susceptor 18.

In FIG. 1b, multiple supply lines 16a, 16b, 16c are shown connected to the internal supply tube 20 and are configured to, collectively, introduce multiple supply gases therein, with flow controllable via supply valves 11a, 11b, and 11c. Thus, a mixture of supply gases can be introduce into the MOCVD growth chamber 10 at a close proximity to the surface 19 of the wafer 17 on the susceptor 18.

Referring again to FIGS. 1a and 1b, the MOCVD growth systems 200 and 202 can also include a movable arm 98 connected to the supply tub 20 and a movable arm 100 connected to the susceptor 18. The movable arm 98 can then be driven by a supply tube moving element 82, and the movable arm 100 can then be driven by a susceptor moving element 84. The supply tube moving element 82 and the susceptor moving element 84 can be controlled by the same system or separate systems and can work individual or together to decrease the distance between the supply tube 20 and the surface 19 of substrate or wafer 17 in order to form a semiconductor layer in a more efficient manner. For instance, the supply tube 20, the susceptor 18, or both can be moved to decrease the distance that the reactants must travel from the supply tube 20 in order to grow a semiconductor layer on the substrate 17.

The internal supply tube 20 shown in FIGS. 1a and 1b can have several configurations, each of which are discussed in greater detail below.

A. Straight Supply Tube

Figure 2A:
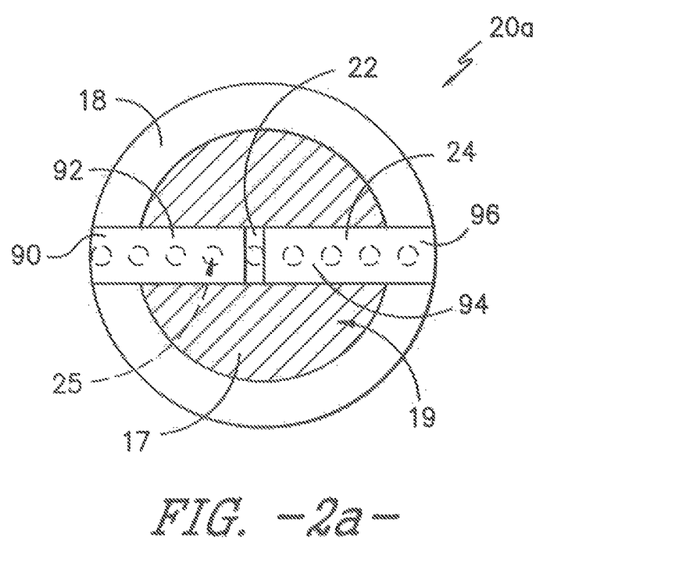
FIG. 2a shows a top view of a straight supply pipe and supply nozzle according to one embodiment.
Figure 2B:
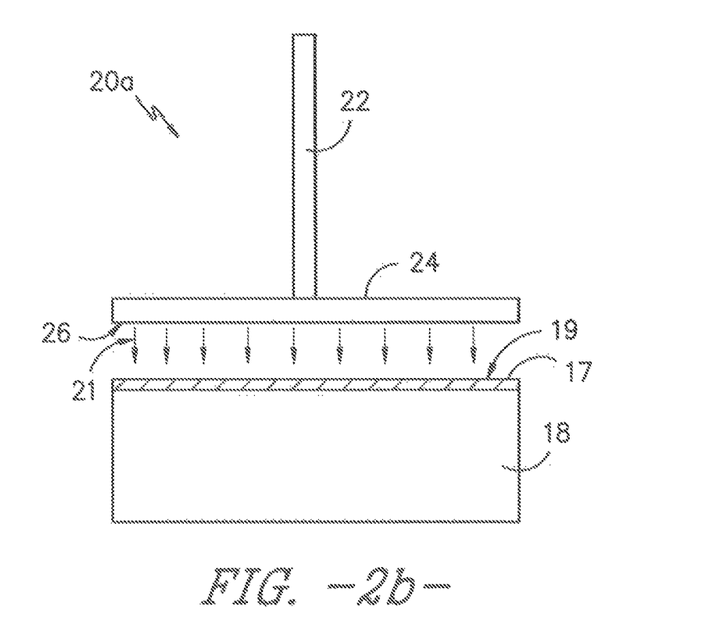

In one embodiment, a straight supply tube 20a is generally provided, as shown in FIGS. 2a and 2b, for introducing a supply gas (e.g., FIG. 1a) or multiple supply gases (e.g., FIG. 1b) into the MOCVD growth chamber 10 at a close proximity to the surface 19 of the wafer 17 on the susceptor 18. The straight supply tube 20a includes a single supply tube 22 that is substantially straight, and pointing towards the center of the substrate 17. A supply head 24 is attached to the end of the single supply tube 22, and defines a substantially flat, straight bar over the surface 19 of the substrate 17. A plurality of apertures 25 are defined in the bottom surface 26 of the supply head 24, and are configured to supply at least one supply gas 21 to the surface 19 of the substrate 17. Referring still to FIG. 2a, the plurality of apertures 25 can be divided into zones, such as first zone 90, second zone 92, third zone 94, and fourth zone 96. The various zones can be separate entrance zone for reactants that can be group III reactants, group V reactants, etc. Likewise, the various zones can be used with any metallic vapor carried through the use of HCl or any other various that may be typically used in hydride vapor phase epitaxy (HVPE) systems. Thus, a potential configuration for the zones of the plurality of apertures 25 on the supply head 24 can include a 4-zone supply head 24 with the first zone 90 and the second zone 92 used for $NH_3$ and metalorganics and with the third zone 94 and the fourth zone 96 used with $NH_3$ and $GaCl_3/GaCl$ formed by passing HCl over Ga-metal.

B. Bent Supply Tube

Figure 3A:
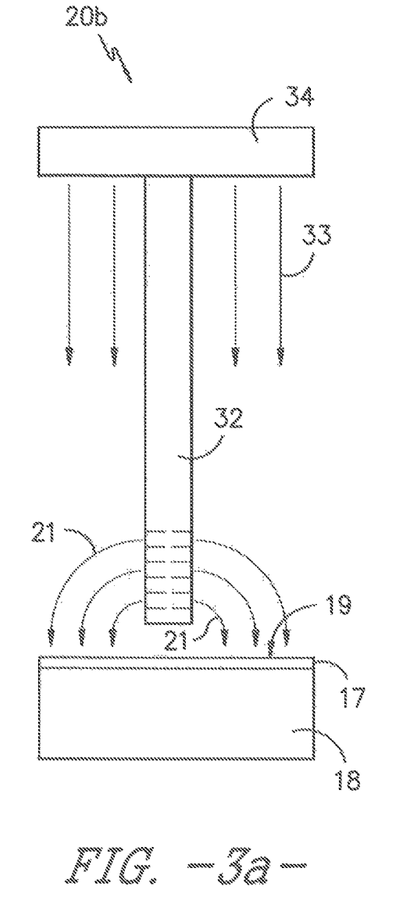
FIG. 3a shows a front view of a bent supply pipe according to another embodiment.
Figure 3B:
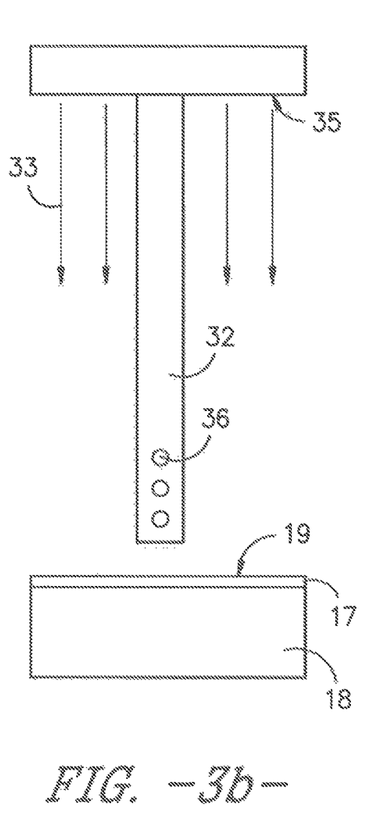

In another embodiment, a bent supply tube 20b is generally provided, as shown in FIGS. 3a and 3b, for introducing a supply gas (e.g., FIG. 1a) or multiple supply gases (e.g., FIG. 1b) into the MOCVD growth chamber 10 at a close proximity to the surface 19 of the wafer 17 on the susceptor 18. The bent supply tube 20b is similar to the straight supply tube 20a, described above, but has been modified to a bent tube 32 that is pointing towards the edges of the substrate 17.

The tube 32 is positioned below a plate 34 defining apertures 35 allowing carrier gas 33 (e.g., ammonia) to flow therethrough and towards the surface 17 of the substrate 19. The supply gas(es) 21 are carried from the supply line(s) 16 through the tube 32 and out of apertures 36 defined by the tube 32 in close proximity to the surface 17 of the substrate 16. The flow of the carrier gas 33 helps to direct the exiting supply gas 21 from the apertures 36 onto the surface 17 of the substrate 16.

Figure 4:
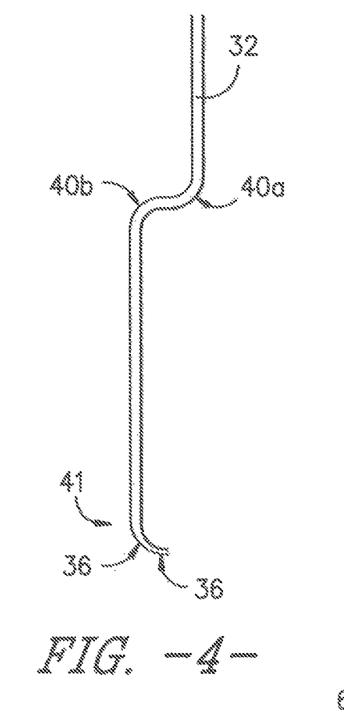
FIG. 4 shows an exemplary bent tube according to one particular embodiment for use in the bent supply pipe of FIGS. 3a and 3b.

FIG. 4 shows an exemplary cross-section of the bent tube 32 having a first bend 40a and a second bend 40b. Collectively, the first bend 40a and second bend 40b help to slow the flow of the supply gas(es) therethrough, which would otherwise be unimpeded in a straight tube. The final bend 41 curves the end portion of the bent tube 32 such that apertures 36 may be directed toward the surface 17 of the substrate 16.

C. Conical Supply Tube

Figure 5A:
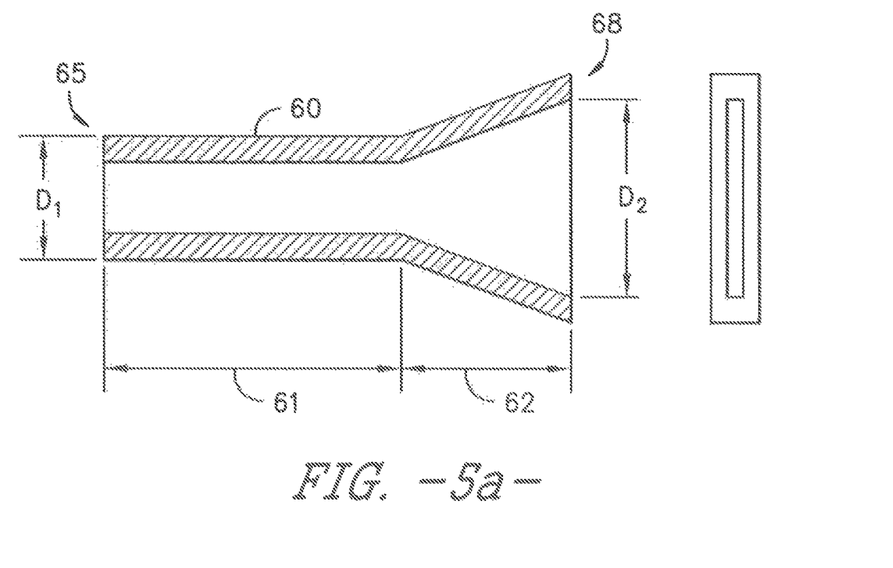
FIG. 5a shows a cross-sectional view of a conical supply tube connected to a shower-like nozzle, according to yet another embodiment.
Figure 5B:
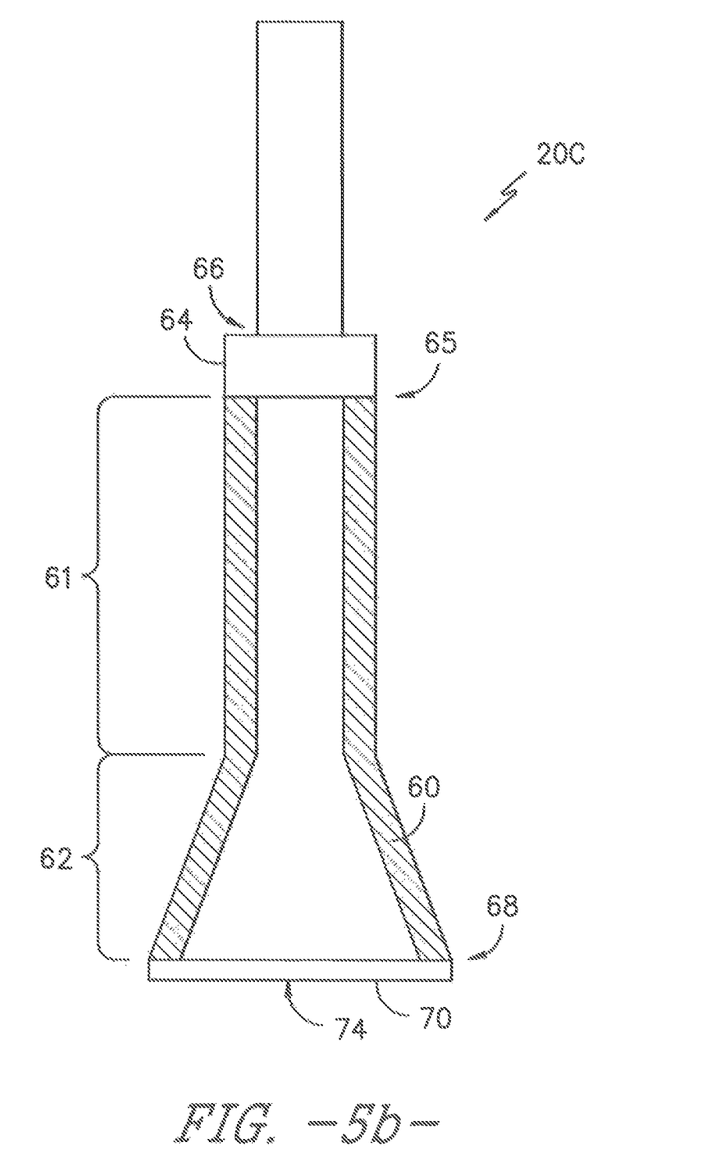
FIG. 5b shows a cross-sectional view of the conical supply tube of FIG. 5a connected to a shower-like nozzle.

In a preferred embodiment, a conical supply tube 20c is generally shown in FIGS. 5a and 5b. The conical supply tube 20c includes a conical head 60 that has an expanding area 62 in at least some portion of its length where the average diameter of the conical head 60 is increasing. Thus, the initial diameter ($D_1$) at the fitting end 65 of the conical head 60 is less than the diameter ($D_2$) at the shower end 68.

Figure 6:
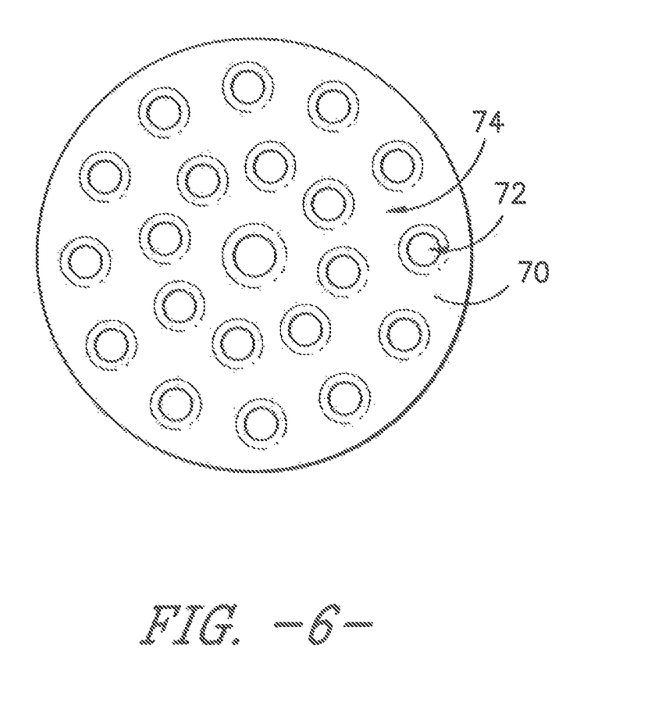
FIG. 6 shows a bottom view of an exemplary shower-like nozzle for use with the conical supply tube of FIG. 5b.

As shown, the expanding area 62 is integral to a tube area 61 to form the conical head 60. In one particular embodiment, the conical head 60 is a hollow structure attached to a shower plate 70 that defines a plurality of apertures 72 such that the supply gas flows through the shower plate 70, as shown in FIG. 6. In use, the bottom surface 74 of the shower plate 70 can be from about 1 inch to about 10 inches from the surface 17 of the substrate 19. It can be positioned anywhere from about 0.5 inches to all the way where the top steel plate of the chamber 10 is located.

The conical head 60 is, in one embodiment, constructed from quartz so as to avoid affecting the rf-coupling or creating other electrical issues during growth. As such, the conical head 60 brings the growth species (i.e., the supply gases) closer to the growing surface 17 and hence adduct formation is severely reduced and the metalorganic incorporation efficiency is significantly higher. It can also be constructed out of ceramics such as BN, AlN or sapphire.

When combined with a higher growth temperatures required for certain semiconductor growth (e.g., greater than or equal to about 1500° C., such as from about 1500° C. to about 2000° C., such as from about 1500° C. to about 1800° C., such as from about 1500° C. to about 1600° C.), growth rates as high as about 0.5 μm per hour to about 10 μm per hour are easily achievable for the semiconductor layer growth while maintaining good uniformity and minimal defects.

When constructed from quartz, a steel sealing 64 can be utilized wherein the quartz tube 60 exits the fitting 66 (e.g., a Swagelock fitting) on growth chamber wall to avoid gas leakage around an O-ring or other linkage at the quartz-to-steel connection. Thus, Variable Compression Ratio (VCR) fittings between the quartz tube and the steel tube can completely avoiding any leaks.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. An MOCVD system for growing a semiconductor layer on a substrate, the MOCVD system comprising:
   an MOCVD growth chamber defined by a jacket having an interior surface and an exterior surface;
   a water flow chamber surrounding an exterior surface of the jacket of the MOCVD growth chamber;
   an electronic control system, wherein the electronic control system facilitates pulsed growth of the semiconductor layer;
   a supply tube comprising a head formed from a hollow structure defining a fitting end and an opposite, shower end, wherein the fitting end has an initial diameter that is less than a diameter at the shower end; and
   a susceptor configured to hold the substrate and facing the shower end of the supply tube, wherein the MOCVD system operates at a temperature greater than or equal to 1500° C.

2. The MOCVD system as in claim 1, wherein the water flow chamber is connected to a water supply line.

3. The MOCVD system as in claim 1, further comprising a liner, wherein the liner is replaceable.

4. The MOCVD system as in claim 3, wherein the liner comprises quartz, boron nitride, a ceramic, or a combination thereof.

5. The MOCVD system as in claim 1, wherein the jacket comprises quartz.

6. The MOCVD system as in claim 1, wherein the head is conical, wherein the fitting end has an initial diameter that is less than a diameter at the shower end, further wherein the head defines an expanding area along its length.

7. The conical supply tube as in claim 6, wherein the conical head comprises quartz, boron nitride, a ceramic, or a combination thereof.

8. The MOCVD system as in claim 1, wherein a shower plate is attached to the shower end of the conical head.

9. The MOCVD system as in claim 8, wherein the shower plate defines a plurality of apertures therein.

10. The MOCVD system as in claim 9, wherein the apertures are substantially equally spaced across the shower plate.

11. The MOCVD system as in claim 8, wherein the shower plate comprises quartz, boron nitride, a ceramic, or a combination thereof.

12. The MOCVD system as in claim 1, wherein the supply tube is connected to an arm, wherein the arm facilitates movement of the supply tube towards the substrate and the susceptor.

13. The MOCVD system as in claim 12, wherein a supply tube moving element controls the movement of the arm.

14. The MOCVD system as in claim 1, wherein the susceptor is connected to an arm, wherein the arm facilitates movement of the substrate and susceptor towards the supply tube.

15. The MOCVD system as in claim 14, where a susceptor moving element controls the movement of the arm.

16. The MOCVD system as in claim 1, wherein a steel sealing is attached to the fitting end of the head to form an air-tight seal.

17. A method for growing a semiconductor layer on a surface of a substrate, the method comprising:
introducing a source gas into the MOCVD chamber of claim 1 through the supply tube, wherein the supply tube defines a terminal end at a distance of about 0.5 inches to about 10 inches from the surface of the substrate, wherein the source gas comprises at least one of a metal-organic source gas, a boron source gas, or a nitrogen source gas; and
cooling the MOCVD chamber via the water flow chamber, wherein water is delivered to the water flow chamber via a water supply line.

18. The method as in claim 17, wherein a liner is disposed on the interior surface of the MOCVD chamber, wherein the liner is removed from the MOCVD chamber and replaced with a new liner after the semiconductor layer is removed from the MOCVD chamber and before an additional semiconductor layer is grown in the MOCVD chamber.

19. The method as in claim 17, wherein the semiconductor layer comprises a group III layer or a group III-V layer.

20. The method as in claim 19, wherein the semiconductor layer comprises an AlInGaBN layer.

* * * * *